United States Patent
Jang et al.

(10) Patent No.: US 11,864,424 B2
(45) Date of Patent: Jan. 2, 2024

(54) PIXEL HAVING CAPACITOR OVERLAPPING WITH OPENING AREA AND DISPLAY DEVICE INCLUDING THE SAME

(71) Applicant: LG DISPLAY CO., LTD., Seoul (KR)

(72) Inventors: Hun Jang, Paju-si (KR); Daeyoung Seo, Paju-si (KR); Soyoung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 197 days.

(21) Appl. No.: 17/388,819

(22) Filed: Jul. 29, 2021

(65) Prior Publication Data

US 2022/0037440 A1  Feb. 3, 2022

(30) Foreign Application Priority Data

Jul. 31, 2020  (KR) .................... 10-2020-0096364

(51) Int. Cl.
*H01L 29/08* (2006.01)
*H10K 59/121* (2023.01)

(52) U.S. Cl.
CPC .............................. *H10K 59/1216* (2023.02)

(58) Field of Classification Search
CPC .................................................. H10K 59/1216
USPC ............................................................ 257/40
See application file for complete search history.

(56) References Cited

U.S. PATENT DOCUMENTS

| | | | | |
|---|---|---|---|---|
| 8,378,938 B2 * | 2/2013 | Nathan | ............... | G09G 3/3258 |
| | | | | 345/82 |
| 8,405,803 B2 * | 3/2013 | Kim | .................. | G02F 1/134363 |
| | | | | 349/39 |
| 2018/0122886 A1 * | 5/2018 | Kim | .................... | H10K 59/1216 |
| 2019/0123114 A1 * | 4/2019 | Park | ....................... | H10K 59/88 |
| 2019/0355802 A1 * | 11/2019 | Shim | .................. | H10K 59/121 |
| 2019/0363117 A1 * | 11/2019 | Li | ............................ | G01T 1/208 |
| 2020/0302840 A1 * | 9/2020 | Kim | ....................... | G09G 3/006 |

FOREIGN PATENT DOCUMENTS

| | | | | |
|---|---|---|---|---|
| EP | 333683 A2 * | 6/2018 | ............... | G09G 3/32 |
| KR | 10-2015-0076485 A | 7/2015 | | |
| KR | 10-2016-0083532 A | 7/2016 | | |
| KR | 10-2018-0014339 A | 2/2018 | | |
| KR | 10-2018-0025520 A | 3/2018 | | |
| KR | 10-2019-0002884 A | 1/2019 | | |
| KR | 10-2019-0013132 A | 2/2019 | | |
| KR | 10-2019-0070768 A | 6/2019 | | |
| KR | 10-2019-0076637 A | 7/2019 | | |

* cited by examiner

*Primary Examiner* — Phuc T Dang
(74) *Attorney, Agent, or Firm* — Polsinelli PC

(57) ABSTRACT

A pixel comprises a pixel circuit connected to gate and data lines, and a light emitting diode having a first electrode connected to the pixel circuit, wherein the pixel circuit may include a driving thin film transistor connected to the first electrode of the light emitting diode, a first capacitor formed in a horizontal direction between a gate electrode and a source electrode of the driving thin film transistor, and a second capacitor formed in a vertical direction between the gate electrode of the driving thin film transistor and the first electrode of the light emitting diode.

19 Claims, 16 Drawing Sheets

GAT

DR_GAT

ST_GAT
SW_GAT

PXL

PIXEL HAVING CAPACITOR OVERLAPPING WITH OPENING AREA AND DISPLAY DEVICE INCLUDING THE SAME

CROSS-REFERENCE TO RELATED APPLICATION

This application claims the benefit of the Korean Patent Application No. 10-2020-0096364 filed on Jul. 31, 2020, which is hereby incorporated by reference in its entirety as if fully set forth herein.

BACKGROUND

Field of the Disclosure

The present disclosure relates to a pixel and a display device including the same.

Description of the Background

With the advancement of the information age, the demand for a display device for displaying an image has increased with various forms. Therefore, various types of display devices such as a liquid crystal display (LCD) device, a plasma display panel (PDP) device, and an organic light emitting display (OLED) device have been recently used.

Among such display devices, the organic light emitting display device is a self-luminance display device using an organic light emitting diode which injects holes from an anode and electrons from a cathode into a light emitting layer and emits light when an exciton generated by combination of the injected holes and electrons changes its state from an excited state to a ground state.

The organic light emitting display device may be categorized into a top emission type, a bottom emission type, and a dual emission type depending on an emitted direction of light, and may be categorized into a passive matrix type and an active matrix type depending on a driving method.

The organic light emitting display device does not need a separate light source unlike a liquid crystal display (LCD) device and thus may be manufactured into a lightweight and thin form. Further, the organic light emitting display device is advantageous in view of power consumption since it is driven with a low voltage. Also, the organic light emitting display device has excellent color expression ability, a high response speed, a wide viewing angle, and a high contrast ratio (CR). Therefore, the organic light emitting display device has been researched as a next-generation display device.

The organic light emitting display device includes a storage capacitor to maintain a certain current when emitting light. The storage capacitor is provided per pixel and occupies a certain area, whereby an aperture ratio is reduced. The aperture ratio has recently become an important issue in accordance with the trend of high resolution of the display device. A current density of the light emitting diode may be lowered by enhancing the aperture ratio, whereby lifespan of the light emitting diode may be increased. Since adaptability of the display device of high resolution is enhanced, an organic light emitting display device having a high aperture ratio is required to be necessarily embodied.

The disclosure of the above-described background art is owned by the inventor of the present disclosure to devise the present disclosure or is technical information acquired by a process of devising the present disclosure, but cannot be regarded as the known art disclosed to the general public before the present disclosure is disclosed.

SUMMARY

The present disclosure has been made in view of the above problems, and the present disclosure is to provide a pixel and a display device including the same, in which an aperture ratio may be improved and a structure may be simplified.

In addition, the features of the present disclosure will be clearly understood by those skilled in the art from the following description of the present disclosure.

In accordance with an aspect of the present disclosure, the above and other features can be accomplished by the provision of a pixel comprising a pixel circuit connected to gate and data lines, and a light emitting diode having a first electrode connected to the pixel circuit, wherein the pixel circuit may include a driving thin film transistor connected to the first electrode of the light emitting diode, a first capacitor formed in a horizontal direction between a gate electrode and a source electrode of the driving thin film transistor, and a second capacitor formed in a vertical direction between the gate electrode of the driving thin film transistor and the first electrode of the light emitting diode.

In accordance with another aspect of the present disclosure, the above and other features can be accomplished by the provision of a display device including the above pixel.

In accordance with other aspect of the present disclosure, the above and other features can be accomplished by the provision of a display device comprising a plurality of subpixels defined by intersection of gate lines and data lines, having an opening area, wherein each of the plurality of subpixels may include a first circuit area disposed at a first side of the opening area, a second circuit area disposed at a second side of the opening area, and a capacitor overlapped with the opening area and formed between the first circuit area and the second circuit area.

In the pixel and the display device including the same according to the present disclosure, the driving thin film transistor may be disposed at the upper side of the light emission area of each subpixel, and the storage capacitor may be embodied in the light emission area, whereby an aperture ratio may be improved and a structure may be simplified. As a result, display performance may be improved by luminance increase based on improvement of the aperture ratio, and lifespan of the light emitting diode may be improved.

In addition to the effects of the present disclosure as mentioned above, additional features of the present disclosure will be clearly understood by those skilled in the art from the following description of the present disclosure.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
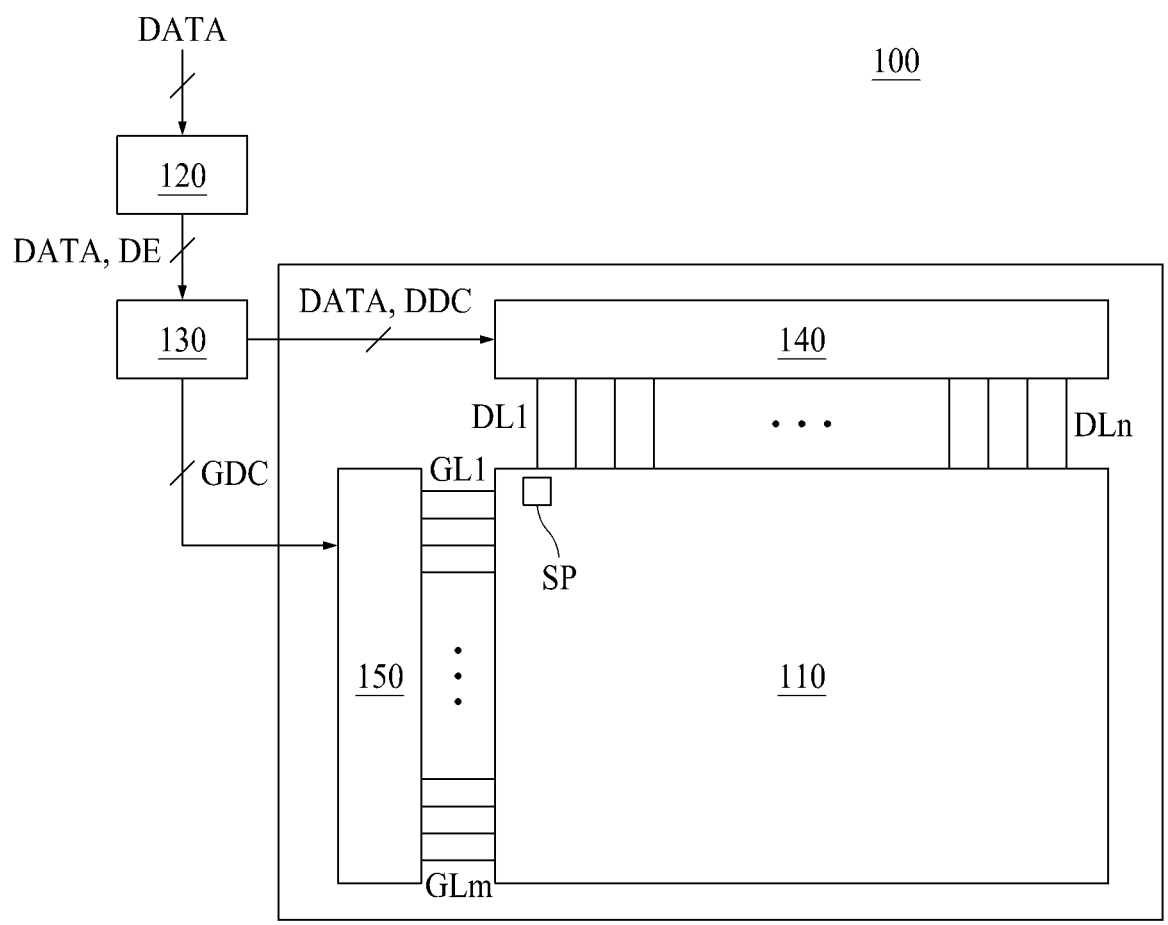
FIG. 1 is a schematic block view illustrating a display device according to various aspects of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, an aspect of a display device according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 2:
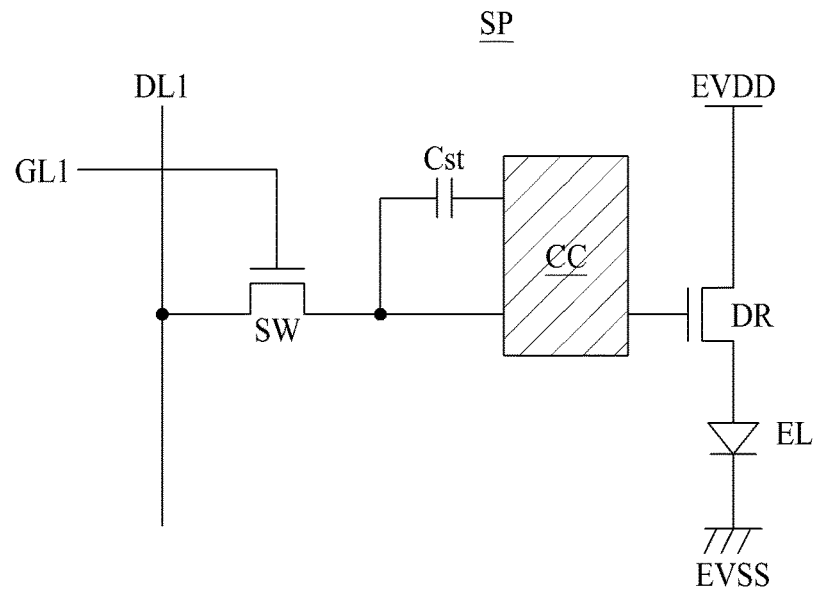
FIG. 2 is a schematic circuit driving view illustrating a subpixel of the display device of FIG. 1.
Figure 3:
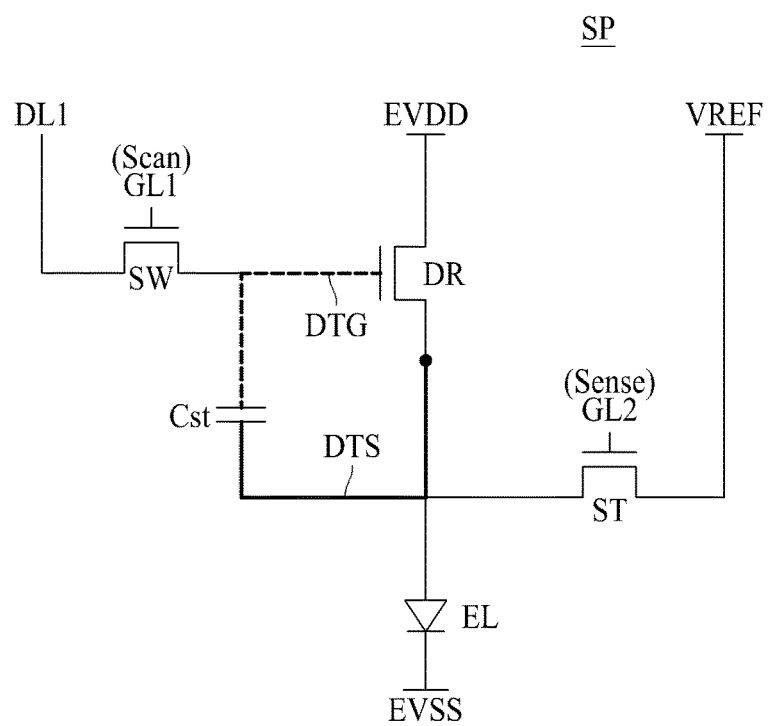
FIG. 3 is an equivalent circuit view illustrating an example of a subpixel of the display device shown in FIG. 1.

FIG. 1 is a schematic block view illustrating a display device according to various aspects of the present disclosure. FIG. 2 is a schematic circuit driving view illustrating a subpixel of the display device of FIG. 1. FIG. 3 is an equivalent circuit view illustrating an example of a subpixel of the display device shown in FIG. 1.

Referring to FIGS. 1 to 3, a display device 100 according to various aspects of the present disclosure may include a display panel 110, an image processor 120, a timing controller 130, a data driver 140, and a scan driver 150.

The display panel 110 may display an image in response to a data signal DATA and a scan signal, which are respectively supplied from the data driver 140 and the scan driver 150. The display panel 110 may include subpixels SP that operate to display an image.

The subpixel may be formed in a top-emission type, a bottom-emission type, or a dual-emission type in accordance with a specific structure. The subpixels SP may include a red subpixel, a green subpixel, and a blue subpixel, or may include a red subpixel, a blue subpixel, a white subpixel and a green subpixel. The subpixels SP may have one or more different light emission areas in accordance with light emission characteristics.

The image processor 120 may output a data enable signal DE together with the data signal DATA supplied from the outside. The image processor 120 may output one or more of a vertical synchronization signal, a horizontal synchronization signal and a clock signal in addition to the data enable signal DE, but these signals will be omitted without being shown for convenience of description.

The timing controller 130 may be supplied with the data signal DATA together with a driving signal, which includes the data enable signal DE or the vertical synchronization signal, the horizontal synchronization signal and the clock signal, from the image processor 120. The timing controller 130 may output a data timing control signal DDC for controlling an operation timing of the data driver 140 and a gate timing control signal GDC for controlling an operation timing of the scan driver 150 on the basis of the driving signal.

The data driver 140 may sample and latch the data signal DATA supplied from the timing controller 130 in response to the data timing control signal DDC supplied from the timing controller 130, convert the latched data signal into a gamma reference voltage and output the converted gamma reference voltage. The data driver 140 may output the data signal DATA through data lines DL1 to DLn. The data driver 140 may be embodied in the form of an Integrated Circuit (IC).

The scan driver 150 may output the scan signal in response to the gate timing control signal GDC supplied from the timing controller 130. The scan driver 150 may output the scan signal through gate lines GL1 to GLm. The scan driver 150 may be embodied in the form of IC (Integrated Circuit), or may be embodied in the display panel 110 in a Gate In Panel (GIP) type.

As shown in FIG. 2, one subpixel SP constituting a unit pixel may include a switching thin film transistor SW, a driving thin film transistor DR, a storage capacitor Cst, a compensation circuit CC, and a light emitting diode EL.

The switching thin film transistor SW may perform a switching operation to store a data signal supplied through the first data line DL1 in the storage capacitor Cst as a data voltage in response to the scan signal supplied through the first gate line GL1. The driving thin film transistor DR may operate to flow a driving current between a first power line EVDD (e.g., high potential voltage) and a second power line EVSS (e.g., low potential voltage) in accordance with the data voltage stored in the storage capacitor Cst. The light emitting diode EL may operate to emit light in accordance with the driving current formed by the driving thin film transistor DR.

The compensation circuit CC is a circuit added within the subpixel to compensate for a threshold voltage of the driving thin film transistor DR. The compensation circuit CC may include one or more thin film transistors. The compensation circuit CC may have various configurations in accordance with a compensation method and thus its example will be described as follows.

As shown in FIG. 3, the compensation circuit CC may include a sensing thin film transistor ST and a sensing line VREF.

The sensing thin film transistor ST may be connected between a drain electrode of the driving thin film transistor DR and an anode electrode of the light emitting diode EL (hereinafter, sensing node). The sensing thin film transistor ST may operate to supply an initialization voltage (or sensing voltage) transferred through the sensing line VREF to the sensing node of the driving thin film transistor DR or sense the sensing node of the driving thin film transistor DR or a voltage or current of the sensing line VREF.

A first electrode (e.g., source electrode) of the switching thin film transistor SW may be connected to the first data line DL1, and a second electrode (e.g., drain electrode) of the switching thin film transistor SW may be connected to a gate electrode of the driving thin film transistor DR.

A first electrode (e.g., source electrode) of the driving thin film transistor DR may be connected to the first power line EVDD, and a second electrode (e.g., drain electrode) of the driving thin film transistor DR may be connected to an anode electrode of the light emitting diode EL.

The storage capacitor Cst may include a first electrode connected to the gate electrode of the driving thin film transistor DR, and a second electrode connected to the anode electrode of the light emitting diode EL. In the display device according to various aspects of the present disclosure, the storage capacitor Cst may include a first electrode pattern DTG connected to the gate electrode of the driving thin film transistor DR and a second electrode pattern DTS connected to the source electrode of the driving thin film transistor DR. The first and second electrode patterns DTG and DTS may be formed by conductorizing an active layer. Also, the storage capacitor Cst may include a first capacitor formed in a horizontal direction and a second capacitor formed in a vertical direction in accordance with various modifications of the first electrode pattern DTG and the second electrode pattern DTS. For example, each of the first and second electrode patterns DTG and DTS may include a finger pattern structure in which the first and second electrode patterns are disposed in parallel on the same plane. A horizontal capacitor may be formed by the structures spaced apart from each other in the horizontal direction. The storage capacitor Cst will be described later in more detail.

The anode electrode of the light emitting diode EL may be connected to the second electrode of the driving thin film transistor DR, and its cathode electrode may be connected to the second power line EVSS. For example, the light emitting diode EL may be an Organic Light Emitting Diode (OLED).

A first electrode (e.g., source electrode) of the sensing thin film transistor ST may be connected to the sensing line VREF, and its second electrode (e.g., drain electrode) may be connected the anode electrode of the light emitting diode EL and the second electrode of the driving thin film transistor DR, which are sensing nodes.

The operation time of the sensing thin film transistor ST may be similar to, the same as, or different from that of the switching thin film transistor SW in accordance with a compensation algorithm (or configuration of the compensation circuit). For example, the gate electrode of the switching thin film transistor SW may be connected to the first gate line GL1, and the gate electrode of the sensing thin film transistor ST may be connected to the second gate line GL2. In this case, the scan signal Scan may be transferred to the first gate line GL1, and a sensing signal Sense may be transferred to the second gate line GL2. For another example, the first gate line GL1 connected to the gate electrode of the switching thin film transistor SW and the second gate line GL2 connected to the gate electrode of the sensing thin film transistor ST may be connected to each other.

The sensing line VREF may be connected to the data driver 140. In this case, the data driver 140 may sense the sensing node of the subpixel for a real time, a non-display period of an image or N frame period (N is an integer of 1 or more), and may generate the sensed result. Meanwhile, the switching thin film transistor SW and the sensing thin film transistor ST may be turned on at the same time. In this case, a sensing operation through the sensing line VREF and a data output operation for outputting a data signal may be separated (identified) from each other by a time division method of the data driver 140.

In addition, a compensation target based on the sensed result may be a digital type data signal, an analog type data signal, or gamma signal. A compensation circuit for generating a compensation signal (or compensation voltage) based on the sensed result may be embodied as an internal circuit of the data driver 140, an internal circuit of the timing controller 130 or a separate circuit.

Also, in the example of FIG. 3, although the subpixel of a 3T (Transistor) 1C (Capacitor) structure that includes the switching thin film transistor SW, the driving thin film transistor DR, the storage capacitor Cst, the light emitting diode EL, and the sensing thin film transistor ST has been described as an example, each subpixel may have a structure of 3T2C, 4T2C, 5T1C, 6T2C, etc. when the compensation circuit CC is added thereto.

Figure 4:
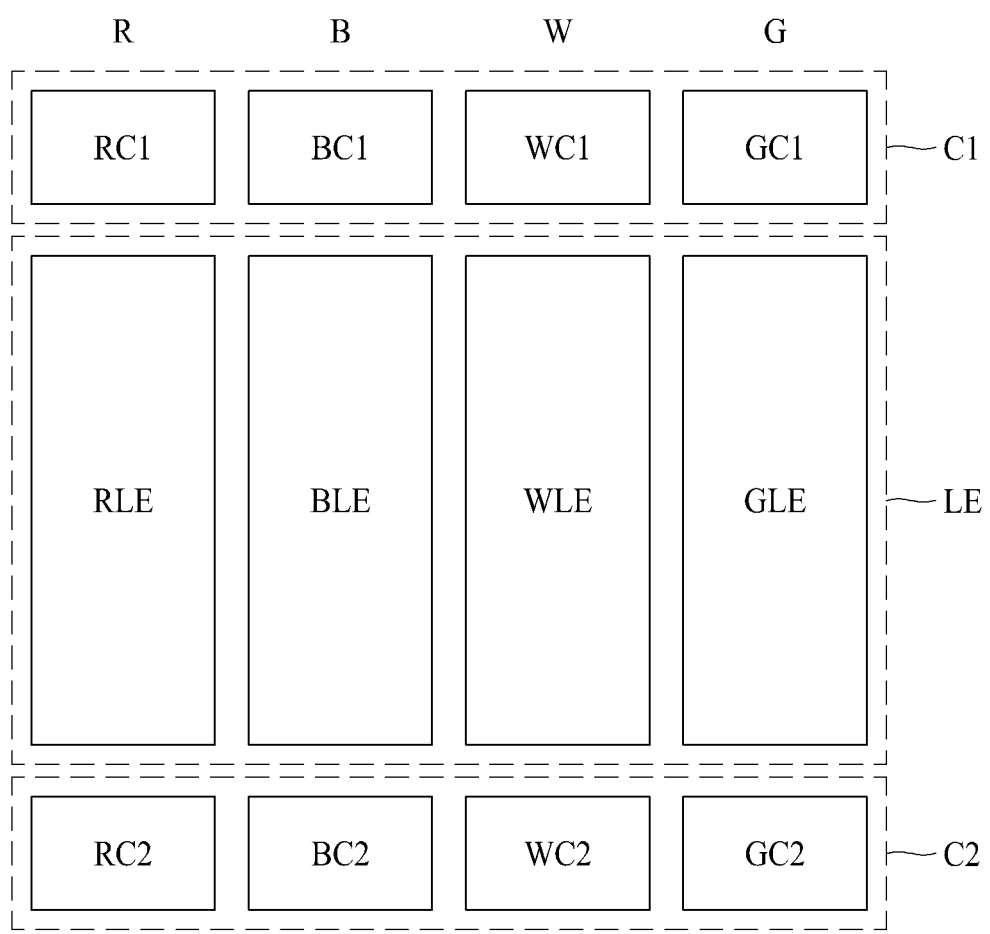
FIG. 4 is a schematic plane view illustrating a unit pixel of a display device according to various aspects of the present disclosure.

FIG. 4 is a schematic plane view illustrating a unit pixel of a display device according to various aspects of the present disclosure. FIG. 4 briefly illustrates a unit pixel comprised of the subpixels of FIG. 3.

Referring to FIG. 4, a unit pixel of the display device according to various aspects of the present disclosure may be comprised of first to fourth subpixels R, B, W and G including a red subpixel R, a blue subpixel B, a white subpixel W and a green subpixel G. However, the present disclosure is not limited to this example of FIG. 4, and the unit pixel may be comprised of first to third subpixels R, G and B including a red subpixel R, a green subpixel G and a blue subpixel B. Also, various modifications may be made in arrangement of at least three or four subpixels included in the unit pixel. In the following description, a 3T1C subpixel will be described as an example.

Each of the first to fourth subpixels R, B, W and G may include an opening area LE where a light emission area is positioned, and first and second circuit areas C1 and C2 respectively disposed at both sides (that is, upper side and lower side of the drawing) of the opening area (or light emission area) LE. That is, in the display device according to various aspects of the present disclosure, the first circuit area C1 and the second circuit area C2 in each of the subpixels R, B, W and G may be separated from each other based on the opening area LE.

In the display device according to various aspects of the present disclosure, driving thin film transistors DR included in the first to fourth subpixels R, B, W and G may respectively be disposed in first circuit areas RC1, BC1, WC1 and GC1, and switching thin film transistors SW and sensing thin film transistors ST may respectively be disposed in second circuit areas RC2, BC2, WC2 and GC2, and storage capacitors Cst may respectively be overlapped with opening areas RLE, BLE, WLE and GLE and disposed between the first circuit areas RC1, BC1, WC1 and GC1 and the second circuit areas RC2, BC2, WC2 and GC2.

Since the display device according to various aspects of the present disclosure includes a first circuit area C1 and a second circuit area C2 at both upper and lower sides with respect to the opening area LE of the subpixels R, B, W and G, the subpixels R, B, W and G of different rows adjacent to one another may disposed in a mirror shape to share a line common among them, whereby an effect for increasing an aperture ratio may be obtained.

Figure 5:
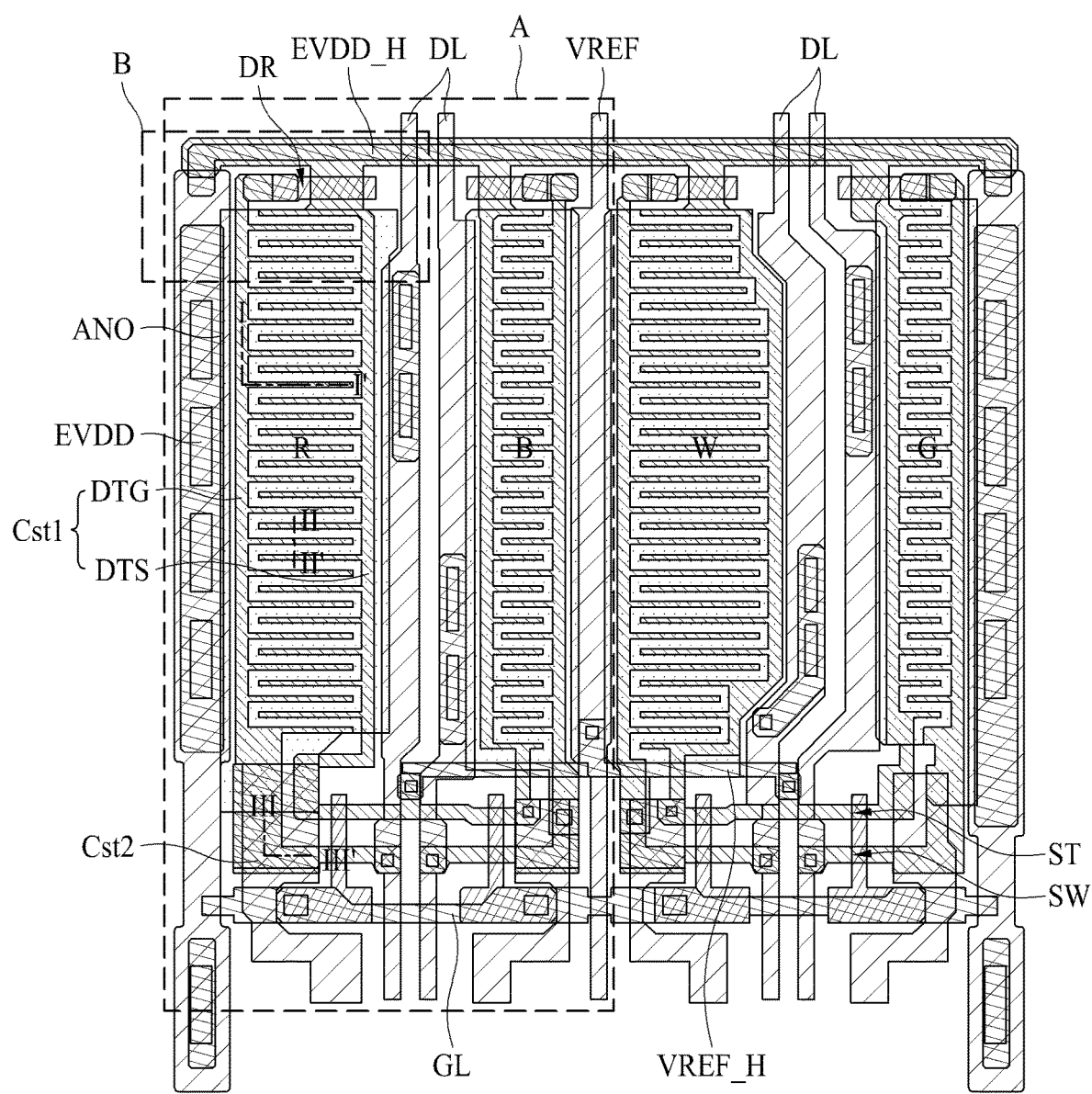
FIG. 5 is a plane view illustrating a unit pixel of a display device according to various aspects of the present disclosure.

FIG. 5 is a plane view illustrating a unit pixel of a display device according to various aspects of the present disclosure. FIG. 5 illustrates the unit pixel of the display device of FIG. 4 in more detail.

Referring to FIG. 5, the display device according to various aspects of the present disclosure may include first to fourth subpixels R, B, W and G constituting one unit pixel.

The respective subpixels R, B, W and G may be defined by intersection between gate lines GL and data lines DL, and may include a light emitting diode PXL, a driving thin film transistor DR, a sensing thin film transistor ST, a switching thin film transistor ST, a first storage capacitor Cst1, and a second storage capacitor Cst2.

A first electrode ANO of the light emitting diode PXL and the first storage capacitor Cst1 may be disposed in an opening area (or light emission area).

The driving thin film transistor DR may be disposed in the first circuit area disposed at one side (e.g., upper side of the opening area) of the opening area, and the sensing thin film transistor ST, the switching thin film transistor SW and the second storage capacitor Cst2 may be disposed in the second circuit area disposed at the other side (e.g., lower side of the opening area) of the opening area.

The respective subpixels R, B, W and G may include an opening area (or light emission area) where the first storage capacitor Cst1, a color filter CF, and the light emitting diode PXL are disposed, a first circuit area disposed at one side (e.g., upper side of the opening area) of the opening area, including the driving thin film transistor DR, and a second circuit area disposed at the other side (e.g., lower side of the opening area) of the opening area, including the sensing thin film transistor ST, the switching thin film transistor SW and the second storage capacitor Cst2.

Four first to fourth subpixels R, B, W and G constituting one unit pixel may be separated from a unit pixel adjacent thereto by using the power lines EVDD as boundaries. For example, the power lines EVDD may respectively be disposed at a left side of the first subpixels R and a right side of the fourth subpixels G, which are arranged in a column direction (e.g., vertical direction). A horizontal power line EVDD_H extended in a horizontal direction and electrically connected with the power lines EVDD of left and right sides may be included between the power lines EVDD. The power line EVDD may be connected to the driving thin film transistors DR disposed in the first circuit area of the first to fourth subpixels R, B, W and G through the horizontal power line EVDD_H.

The data lines DL may be disposed in parallel between the first subpixels R and the second subpixels B and between the third subpixels W and the fourth subpixels G, which are arranged in a column direction. The data lines may supply the data signal to the switching thin film transistors SW disposed in the second circuit area of the subpixels R, B, W and G.

The reference line VREF may be disposed to be extended along the column direction between the second subpixels B and the third subpixels W, which are arranged in the column direction. The reference line VREF may include a horizontal reference line VREF_H extended toward left and right sides in a horizontal direction. The reference line VREF may be connected to the sensing thin film transistor ST, which is disposed in the second circuit area of the first to fourth subpixels R, B, W and G, through the horizontal reference line VREF_H.

Figure 6:
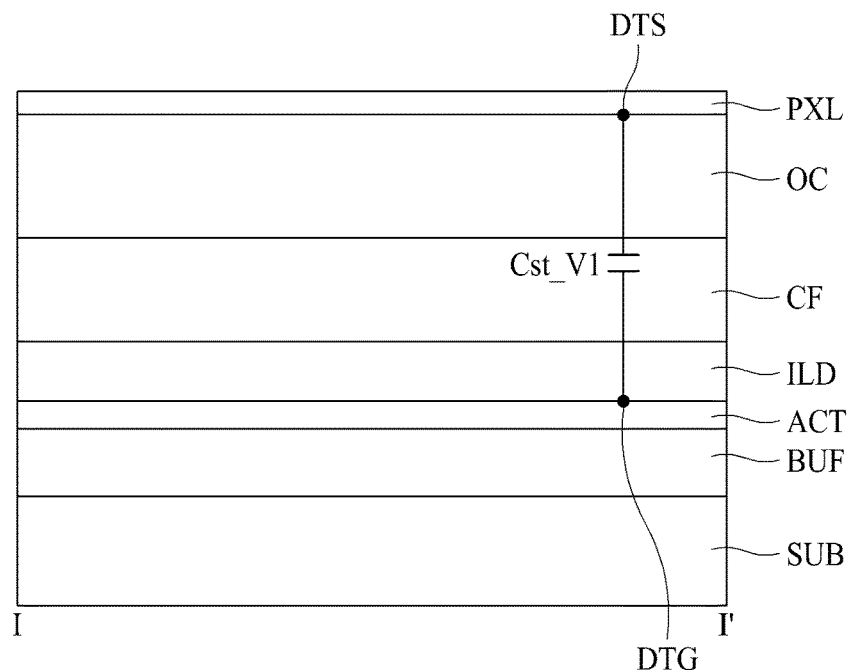
FIG. 6 is a cross-sectional view taken along line I-I' of FIG. 5.
Figure 7:
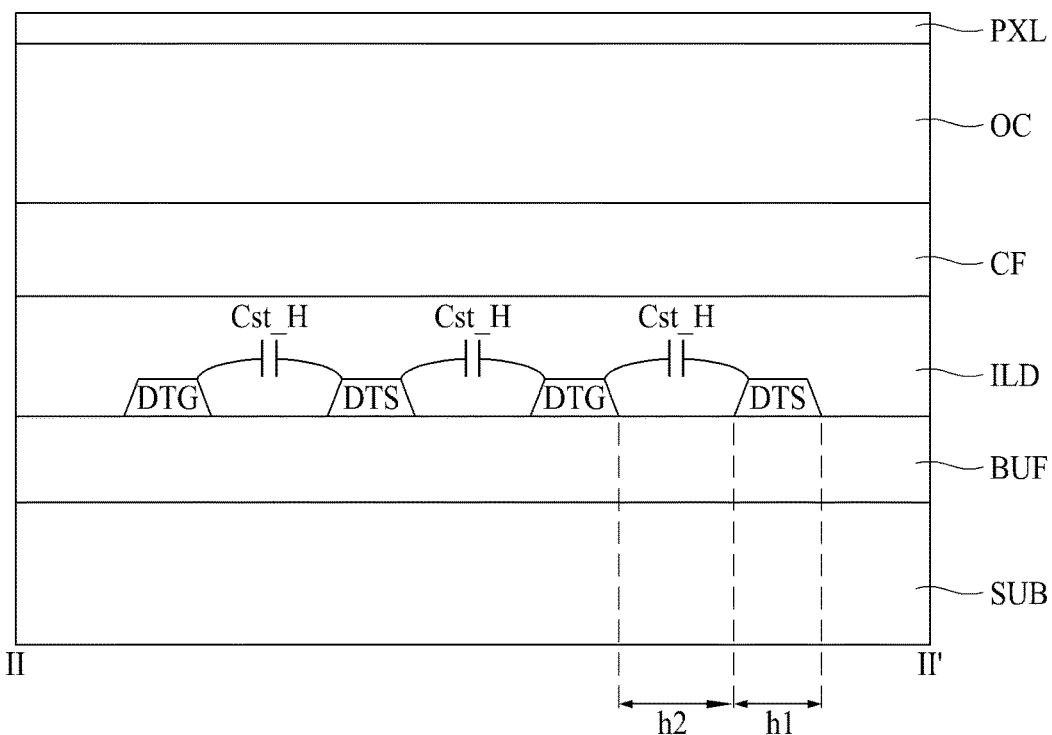
FIG. 7 is a cross-sectional view taken along line II-IF of FIG. 5.
Figure 8:
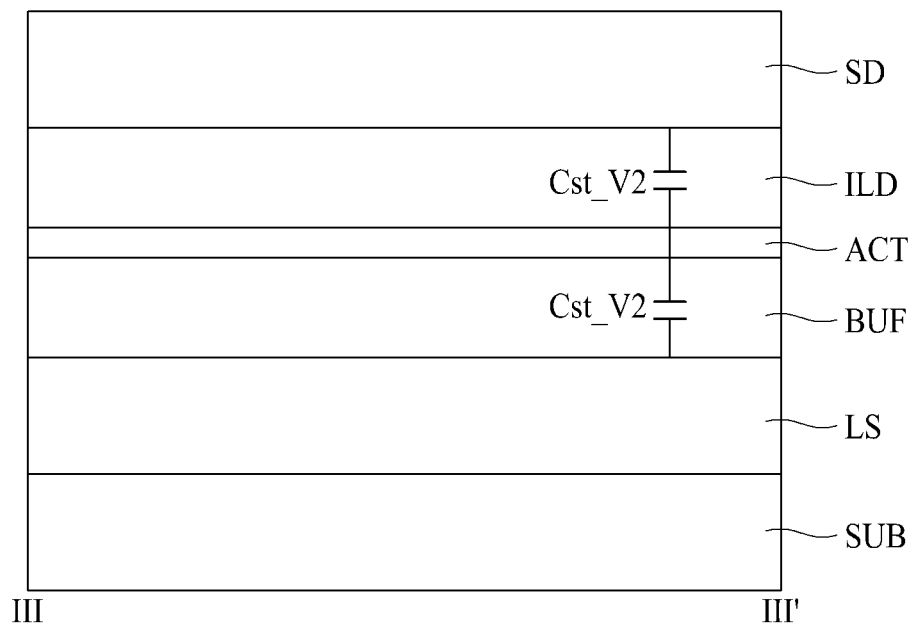
FIG. 8 is a cross-sectional view taken along line III-III' of FIG. 5.
Figure 9:
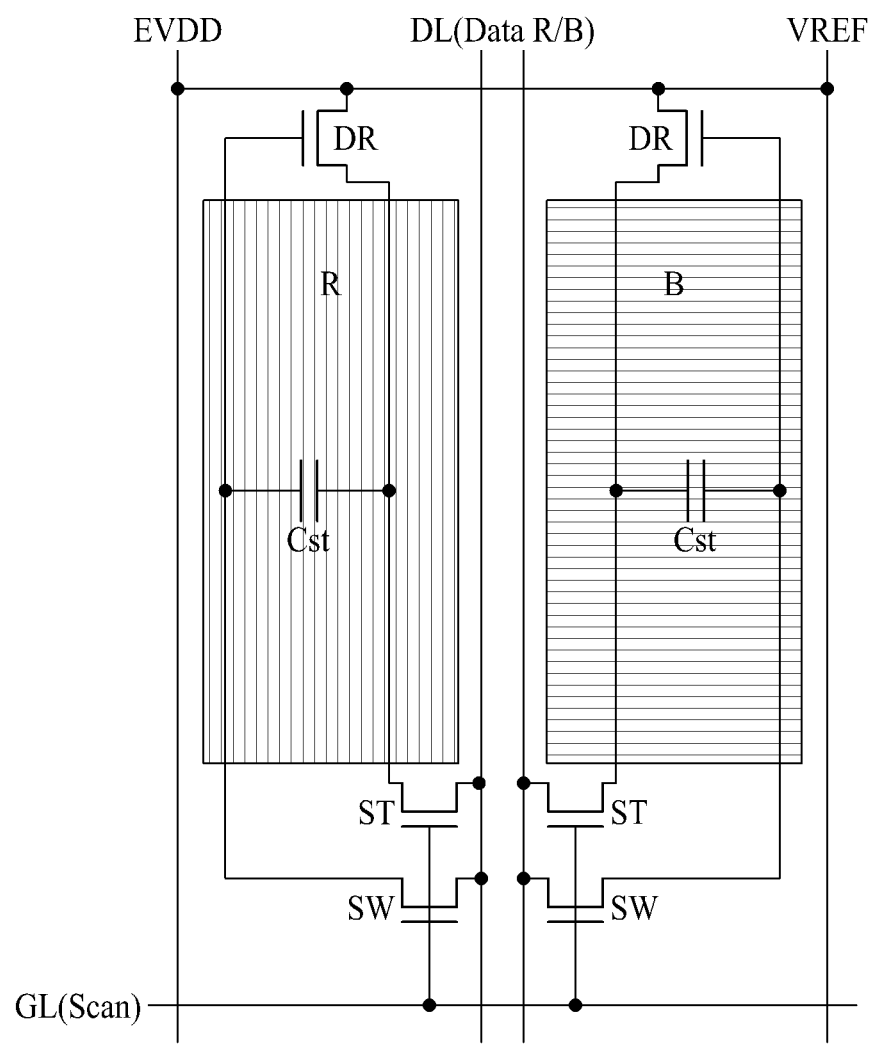
FIG. 9 is an equivalent circuit view illustrating a storage capacitor of subpixels of a portion A of FIG. 5.

FIG. 6 is a cross-sectional view taken along line I-I' of FIG. 5. FIG. 7 is a cross-sectional view taken along line II-IF of FIG. 5. FIG. 8 is a cross-sectional view taken along line III-III' of FIG. 5. FIG. 9 is an equivalent circuit view illustrating a storage capacitor of subpixels of a portion A of FIG. 5. These drawings are intended to specifically describe a storage capacitor Cst in the display device according to various aspects of the present disclosure.

The sectional structure of the storage capacitor Cst in the display device according to various aspects of the present disclosure will be described with reference to FIGS. 6 to 9 in connection with FIG. 5.

As shown in FIG. 6, a buffer layer BUF, an active layer ACT, an inter-layer dielectric film ILD, a color filter CF, an over coat layer OC and a light emitting diode PXL may be disposed in the opening area of each of the subpixels R, B, W and G.

The buffer layer BUF may be formed on an entire surface of the substrate SUB, and the active layer ACT on the buffer layer BUF may be connected to any one of the gate electrode and the source electrode of the driving thin film transistor DR. For example, in FIG. 6, the active layer ACT may be the first electrode pattern DTG conductorized by being connected to the gate electrode of the driving thin film transistor DR. Alternatively, the active layer ACT may be the second electrode pattern DTS conductorized by being connected to the source electrode of the driving thin film transistor DR.

The inter-layer dielectric film ILD, the color filter CF, the overcoat layer OC, and the light emitting diode PXL may be formed on the active layer ACT.

The first electrode pattern DTG formed by conductorization of the active layer ACT and the first electrode ANO of the light emitting diode PXL may be spaced apart from each other by interposing the inter-layer dielectric film ILD, the color filter CF, and the overcoat layer OC, whereby a vertical capacitor Cst_V1 may be formed in a vertical direction. Alternatively, the vertical capacitor Cst_V1 may be formed in a vertical direction between the second electrode pattern DTS formed by conductorization of the active layer ACT and the first electrode ANO of the light emitting diode PXL.

As shown in FIG. 7, in the opening area of each of the subpixels R, B, W and G, the buffer layer BUF, the active layer ACT, the inter-layer dielectric film ILD, the color filter CF, the overcoat layer OC and the light emitting diode PXL may be disposed on the substrate SUB.

The buffer layer BUF may be formed on the entire surface of the substrate SUB, and the active layer ACT on the buffer layer BUF may be connected to any one of the gate electrode and the source electrode of the driving thin film transistor DR. For example, in FIG. 7, the active layer ACT may be a finger pattern structure in which each of a plurality of first electrode patterns DTG conductorized by being connected to the gate electrode of the driving thin film transistor DR and each of a plurality of second electrode patterns DTS conductorized by being connected to the source electrode of the driving thin film transistor DR are disposed on the same plane in parallel. A width h1 of each of the plurality of first and second electrode patterns DTG and DTS may be smaller than a width h2 between the first and second electrode patterns DTG and DTS.

The plurality of first electrode patterns DTG and the plurality of second electrode patterns DTS, which are formed by conductorization of the active layer ACT, may be disposed alternately, whereby a horizontal capacitor Cst_H may be formed in a horizontal direction between the first and second electrode patterns.

Referring to FIGS. 6 and 7, a first storage capacitor Cst1, which includes the vertical capacitor Cst_V1 shown in FIG. 6 and the horizontal capacitor Cst_H shown in FIG. 7, may be formed in the opening area of each of the subpixels R, B, W and G. For example, based on the red subpixel R, the first storage capacitor Cst1 of the opening area may be a capacitor in which the vertical capacitor Cst_V1 and the horizontal capacitor Cst_H are combined with each other.

As shown in FIG. 8, in the second circuit area of each of the subpixels R, B, W and G, a light-shielding layer LS, the buffer layer BUF, the active layer ACT, the inter-layer dielectric film ILD and a source/drain electrode SD may be disposed on the substrate SUB.

The light-shielding layer LS may be disposed on the substrate SUB to overlap the active layer ACT and the source/drain electrode SD. The active layer ACT on the buffer layer BUF may be connected to any one of the gate electrode and the source electrode of the driving thin film transistor DR. For example, in FIG. 8, the active layer ACT may be the first electrode pattern DTG conductorized by being connected to the gate electrode of the driving thin film transistor DR. Alternatively, the active layer ACT may be the second electrode pattern DTS conductorized by being connected to the source electrode of the driving thin film transistor DR.

The inter-layer dielectric film ILD and the source/drain electrode SD may be formed on the active layer ACT. That is, the light-shielding layer LS may be disposed below the active layer ACT by interposing the buffer layer BUF, and the source/drain electrode SD may be disposed above the active layer ACT by interposing the inter-layer dielectric film ILD.

In the first electrode pattern DTG formed by conductorization of the active layer ACT, dual vertical capacitors Cst_V2 may be formed in a vertical direction to each of the light-shielding layer LS therebelow and the source/drain electrode SD thereabove by being spaced apart from the light-shielding layer LS by interposing the buffer layer BUF and being spaced apart from the source/drain electrode SD by interposing the inter-layer dielectric film ILD.

Referring to FIG. 9, in the display device according to various aspects of the present disclosure, the storage capacitor Cst may be overlapped with the opening areas of the subpixels R and B and formed between the driving thin film transistor DR of the first circuit area and the sensing thin film transistor ST of the second circuit area. For example, based on the red subpixel R, the capacitor, in which the vertical storage capacitor Cst_V1 and the horizontal capacitor Cst_H corresponding to the first storage capacitors Cst1 of the opening area are combined with each other, and the dual vertical capacitors Cst_V2 of a non-opening area (or the second circuit area) may be combined with each other to form the storage capacitor Cst.

Figure 10:
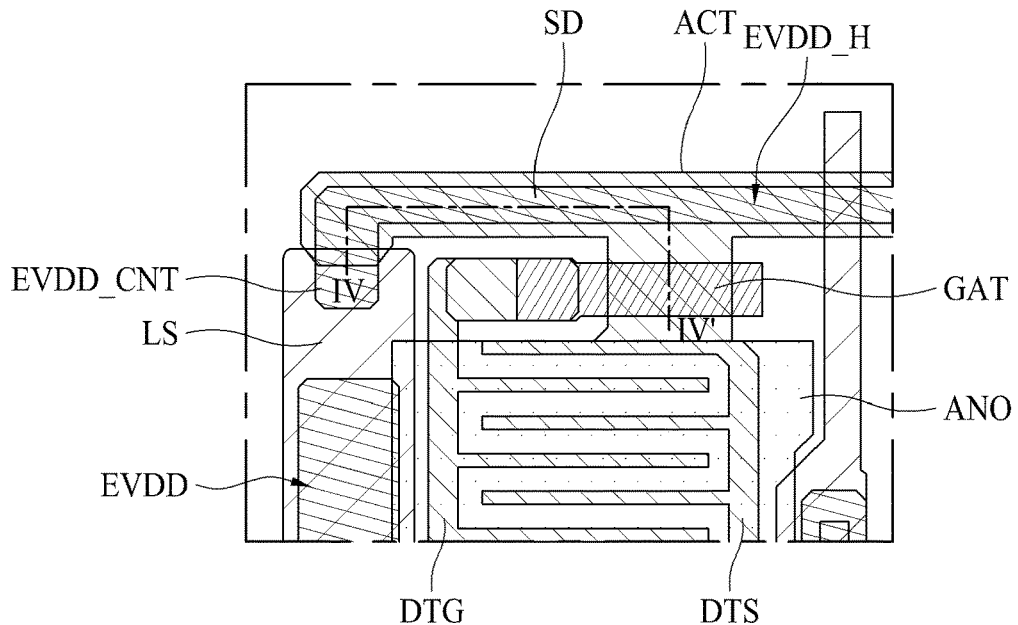
FIG. 10 is an enlarged view of a portion B of FIG. 5.
Figure 11:
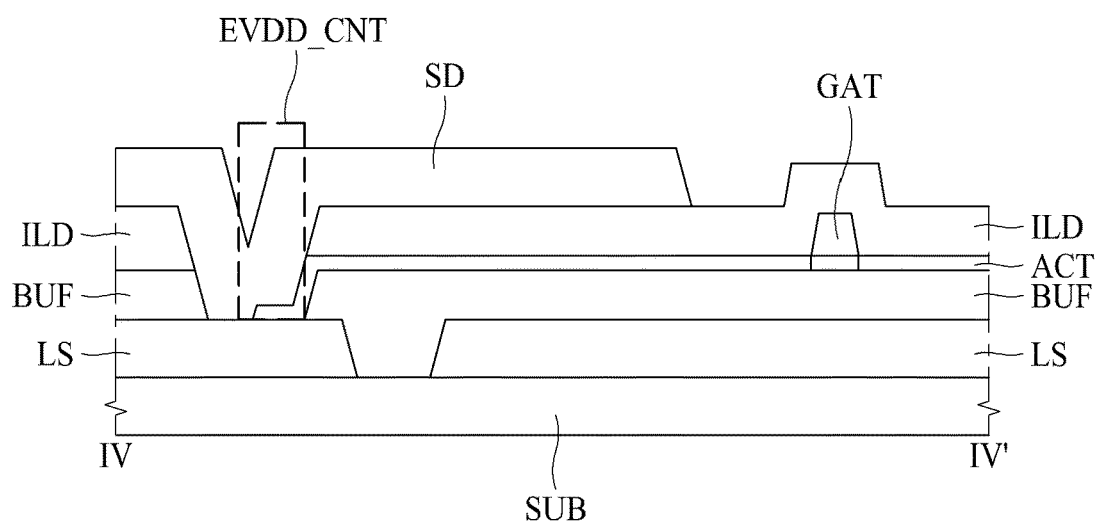
FIG. 11 is a cross-sectional view taken along line IV-IV' of FIG. 10.

FIG. 10 is an enlarged view of a portion B of FIG. 5. FIG. 11 is a cross-sectional view taken along line IV-IV' of FIG. 10.

Referring to FIGS. 10 and 11 in connection with FIG. 5, in the display device according to various aspects of the present disclosure, the active layer ACT may be connected to the source electrode of the driving thin film transistor DR, and may be extended to overlap at least a portion of the horizontal power line EVDD_H.

As shown in FIG. 10, a portion of the active layer ACT may be overlapped with the gate electrode GAT of the driving thin film transistor DR and extended from the gate electrode GAT to overlap the horizontal power line EVDD_H, whereby the portion of the active layer ACT may be formed to be extended to a position where the power line EVDD and the horizontal power line EVDD_H adjoin each other.

As shown in FIG. 11, the light-shielding layer LS, the buffer layer BUF, the active layer ACT, the gate electrode GAT, the inter-layer dielectric film ILD, and the source/drain electrode SD may be disposed on the substrate SUB.

The light-shielding layer LS may be disposed on the substrate SUB to overlap the active layer ACT and the source/drain electrode SD, and may directly contact the source/drain electrode SD by interposing the active layer ACT in a contact area EVDD_CNT.

In the display device according to various aspects of the present disclosure, since the contact area EVDD_CNT with which the light-shielding layer LS, the active layer ACT and the source/drain electrode SD directly contact may be formed in the power line EVDD, a contact hole for contacting the driving thin film transistor DR with the source/drain electrode SD may be deleted from the opening area, whereby an aperture ratio may be increased. Also, line resistance load of the horizontal power line EVDD_H may be reduced by dual lines of the active layer ACT and the source/drain electrode SD.

FIGS. 12 to 16 are plane views illustrating a single layer structure of a portion of the unit pixel shown in FIG. 5.

Referring to FIGS. 12 to 16 in connection with FIG. 5, subpixels constituting a unit pixel in the display device according to various aspects of the present disclosure will be described in more detail.

Figure 12:
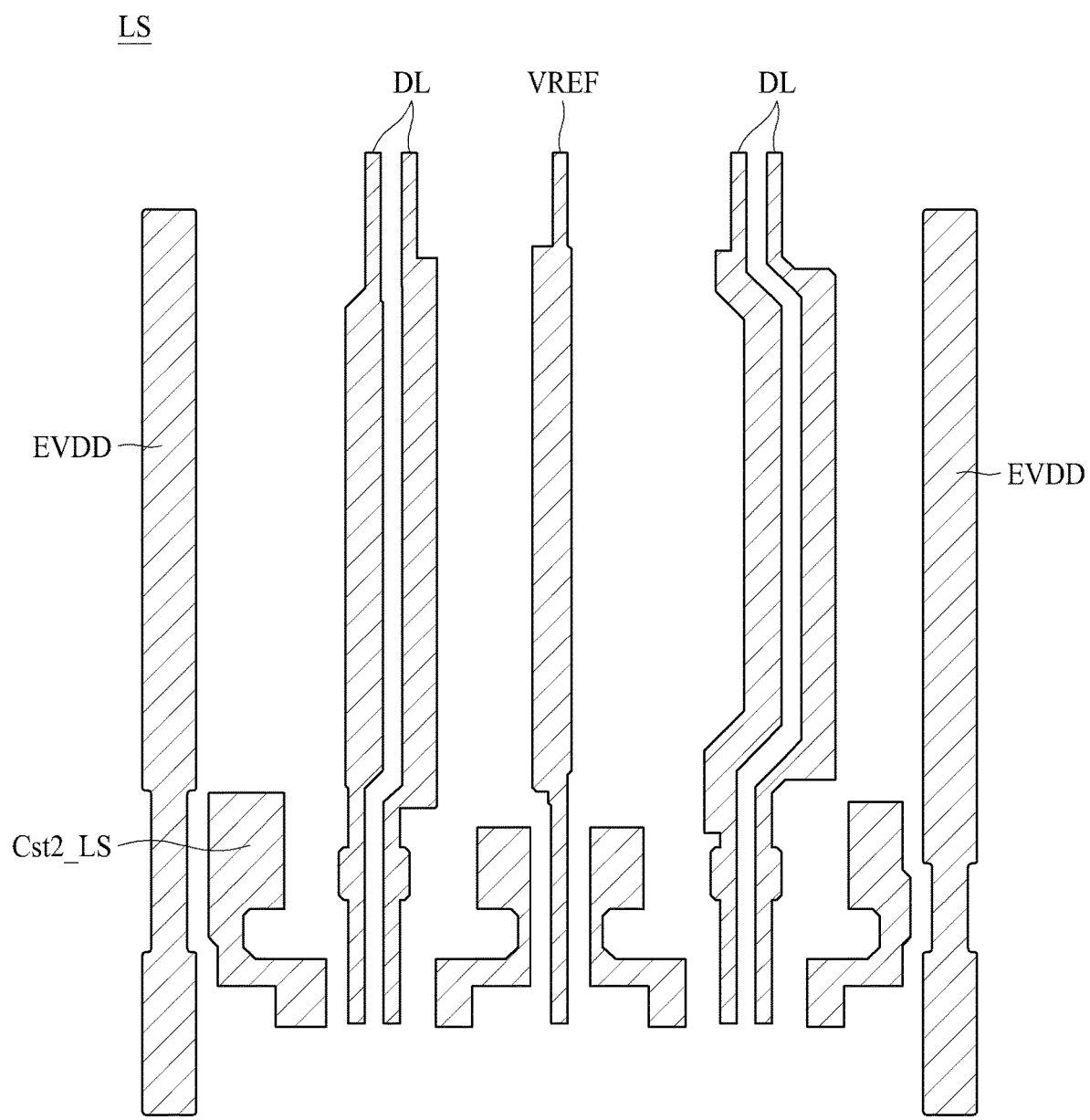
FIGS. 12 to 16 are plane views illustrating a single layer structure of a portion of a unit pixel shown in FIG. 5.

As shown in FIG. 12, power lines EVDD arranged to be parallel with each other along a first direction (for example, direction from a left side to a right side) and extended in a second direction (for example, vertical direction) crossing the first direction, two groups of data lines DL disposed to be adjacent to each other in parallel with the power lines EVDD between the power lines EVDD, and a reference line VREF disposed to be parallel with the data lines DL between the data lines DL may be formed on the substrate. The power lines EVDD, the data lines DL and the reference line VREF may be formed by the light-shielding layer LS.

A light-shielding pattern Cst2_LS corresponding to the sensing thin film transistor ST and the switching thin film transistor SW formed in the second circuit areas of the first to fourth subpixels R, B, W and G and forming the second storage capacitor Cst2 may be disposed.

The buffer layer BUF may be disposed on the substrate, on which the elements shown in FIG. 12 are formed, to cover the elements. The buffer layer BUF may serve to protect the thin film transistor formed by a subsequent process from impurities such as alkali ion leaking from the light-shielding layer LS or the substrate. The buffer layer BUF may be a silicon oxide (SiOx), a silicon nitride (SiNx) or a multi-layer of SiOx and SiNx.

Figure 13:
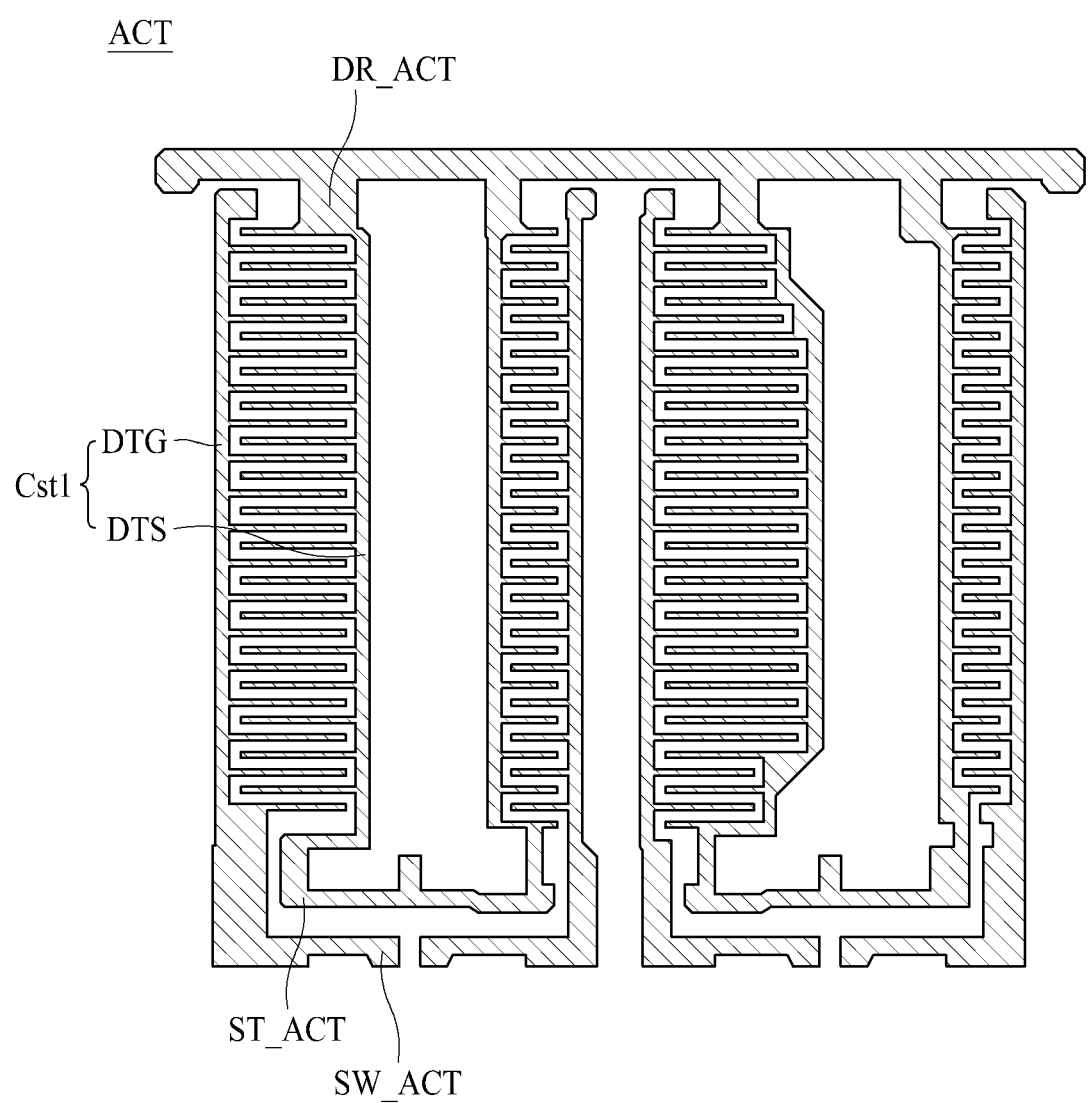

As shown in FIG. 13, the active layer ACT may be disposed on the buffer layer BUF.

The active layer ACT may include an active layer DR_ACT of the driving thin film transistor DR disposed in first circuit areas RC1, BC1, WC1 and GC1 of the respective subpixels R, B, W and G, an active layer ST_ACT of the sensing thin film transistor ST disposed in second circuit areas RC2, BC2, WC2 and GC2, and an active layer SW_ACT of the switching thin film transistor SW. Also, the active layer ACT may include an active layer constituting a first electrode pattern DTG and a second electrode pattern DTS, which are disposed in the opening areas of the respective subpixels R, B, W and G. In the active layer ACT, a portion connected with the gate electrode of the driving thin film transistor DR of the first circuit area, a portion constituting the first electrode pattern DTG in the opening area, and a portion constituting the switching thin film transistor SW of the second circuit area may be formed in a single body. Also, in the active layer ACT, a portion connected with the source electrode of the driving thin film transistor DR of the first circuit area, a portion constituting the second electrode pattern DTS in the opening area, and a portion constituting the sensing thin film transistor ST of the second circuit area may be formed in a single body.

Each of the first electrode pattern DTG and the second electrode pattern DTS of the active layer ACT in the opening area may be formed in a first common pattern, a second common pattern, and a plurality of first and second electrode patterns commonly connected to the first common pattern and the second common pattern and disposed in parallel in a finger pattern structure.

Figure 14:
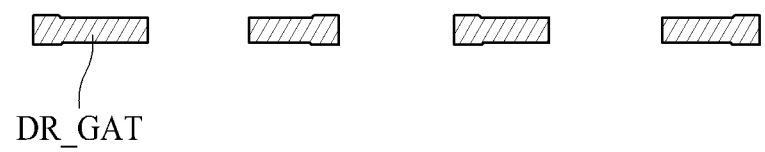
Figure 14:
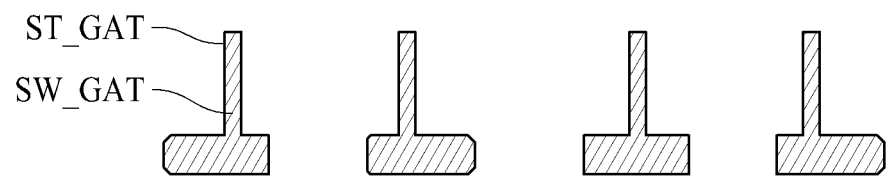

As shown in FIG. 14, a gate electrode DR_GAT for constituting the driving thin film transistor DR may be formed in the first circuit areas of the first to fourth subpixels R, B, W and G, and a gate electrode ST_GAT for constituting the sensing thin film transistor ST and a gate electrode SW_GAT for constituting the switching thin film transistor SW may be disposed in the second circuit areas. The gate electrode ST_GAT of the sensing thin film transistor ST and the gate electrode SW_GAT of the switching thin film transistor SW may be formed in a single body.

The inter-layer dielectric film ILD may be disposed on the substrate on which the elements shown in FIG. 14, to cover the elements. The inter-layer dielectric film ILD may be a silicon oxide (SiOx), a silicon nitride (SiNx) or a multi-layer of SiOx and SiNx.

Figure 15:
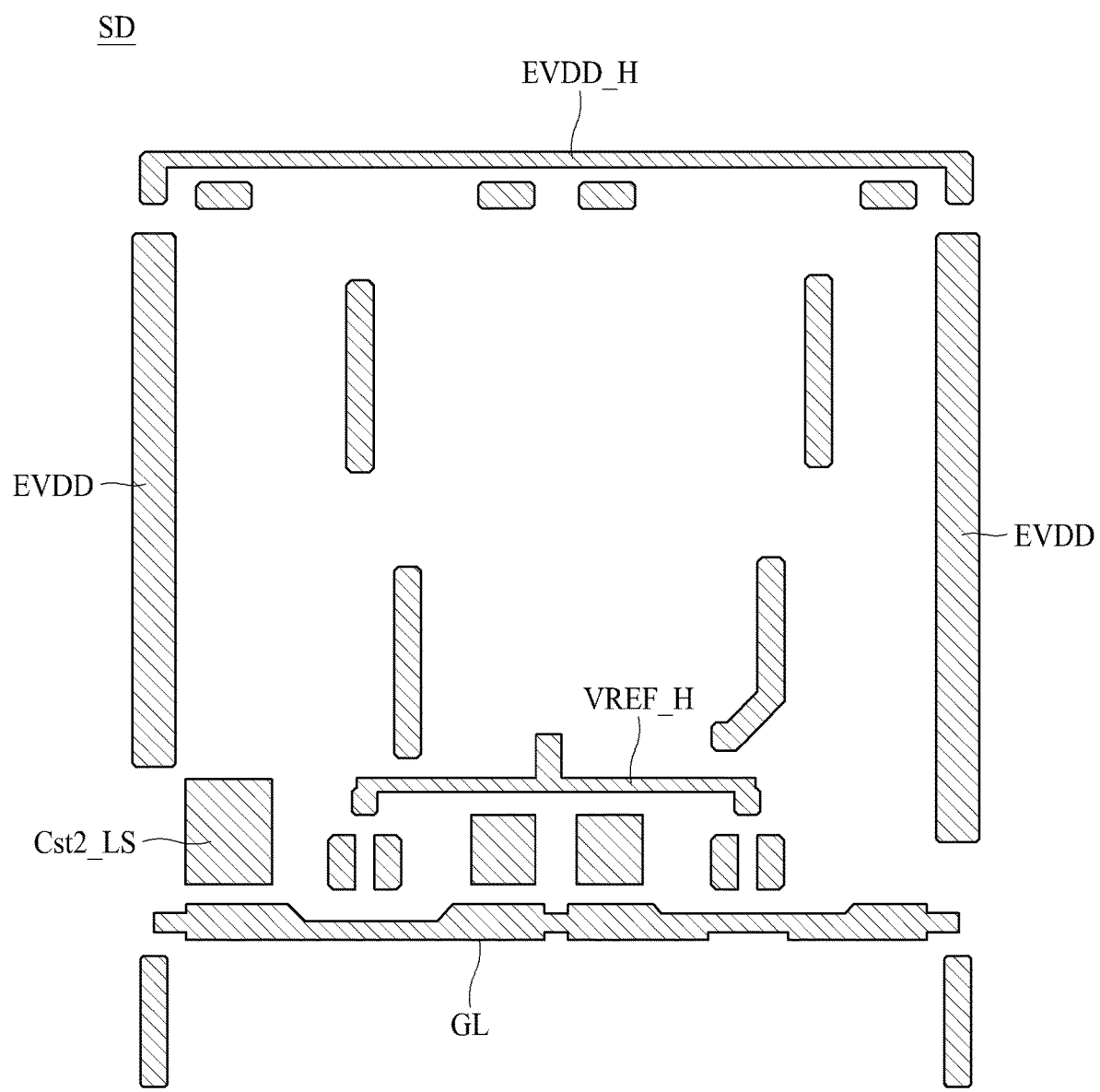

As shown in FIG. 15, the power line EVDD, the horizontal power line EVDD_H, the horizontal reference line VREF_H, and the gate line GL may be formed on the inter-layer dielectric film ILD. Also, the source/drain electrode SD of the driving thin film transistor DR formed in the first circuit areas of the first to fourth subpixels R, B, W and G and the source/drain electrodes SD of the sensing thin film transistor ST and the switching thin film transistor SW formed in the second circuit areas may be formed.

The elements shown in FIG. 15 may be formed of the same material, and may be a multi-layer made of one selected from a group of Mo, Al, Cr, Au, Ti, Ni, Nd and Cu, or their alloy. For example, the elements may be made of a double layer of Cu/MoTi.

Also, a passivation film PAS may be disposed to cover all of the elements shown in FIG. 15. The passivation film PAS is an insulating film for protecting elements therebelow, and may be a silicon oxide (SiOx), a silicon nitride (SiNx) or a multi-layer of SiOx and SiNx.

Red, blue, white and green color filters CF may be disposed on the passivation film PAS to correspond to the opening areas of the respective subpixels R, B, W and G. The color filters CF may emit light of red, blue, white and green colors by passing through white light emitted from the light emitting diode PXL.

The overcoat layer OC may be disposed on the color filters CF to cover the color filters CF. The overcoat layer OC may be a planarization film that mitigates a step difference of a lower structure.

Figure 16:
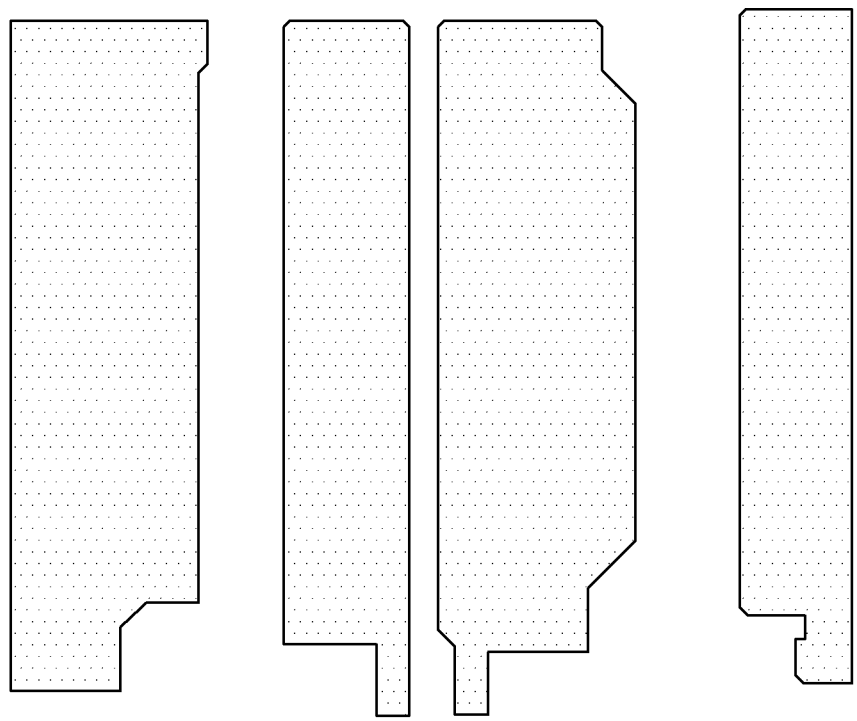

As shown in FIG. 16, the light emitting diodes PXL may be disposed on the overcoat layer OC to correspond to the opening area of each of the subpixels R, B, W and G. The light emitting diodes PXL may include a first electrode (e.g., anode electrode ANO), a light emitting layer, and a second electrode (e.g., cathode electrode). For example, the light emitting diode PXL may be an organic light emitting diode (OLED).

Figure 17:
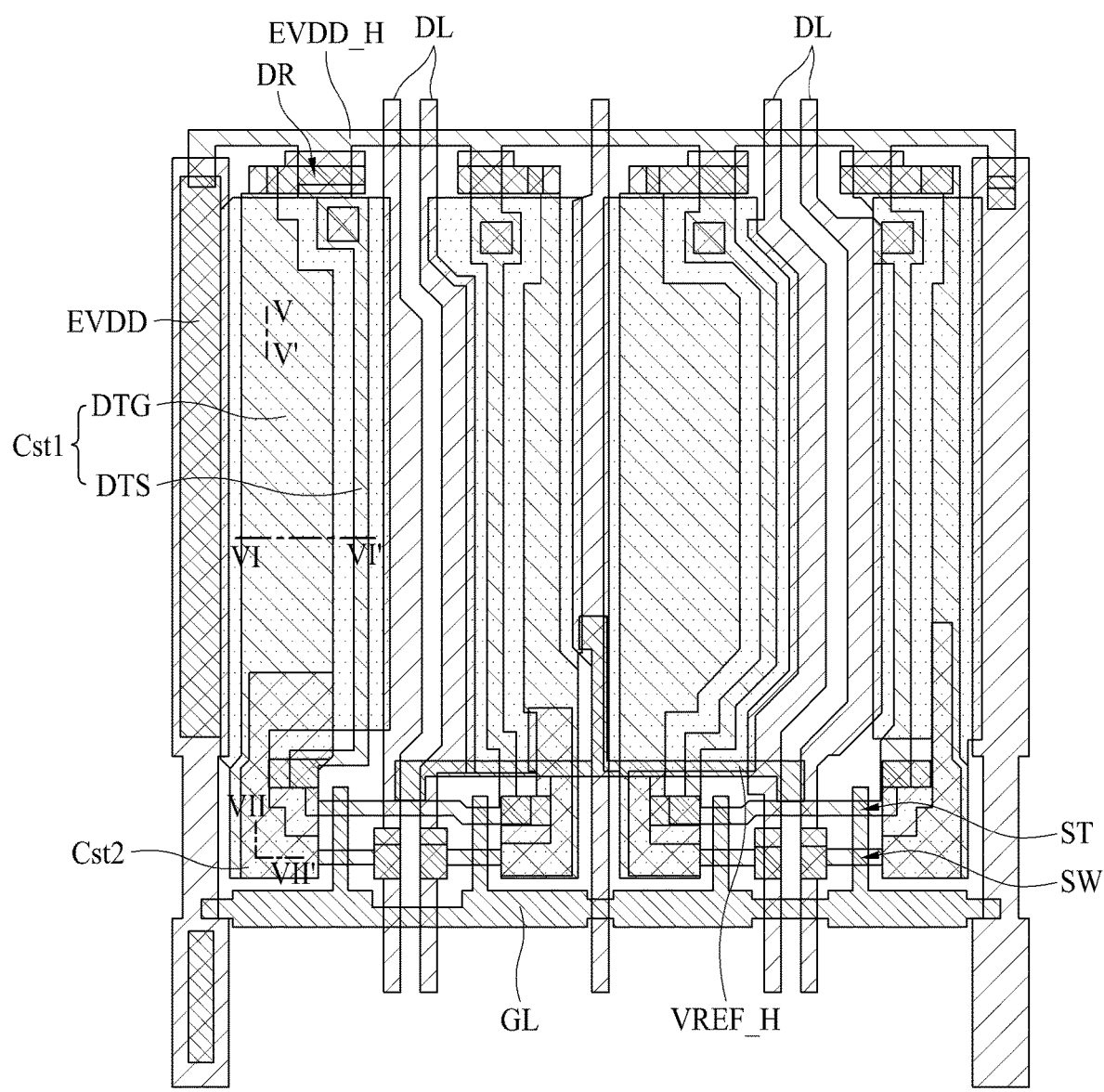
FIG. 17 is a plane view illustrating a unit pixel of a display device according to various aspects of the present disclosure.
Figure 18:
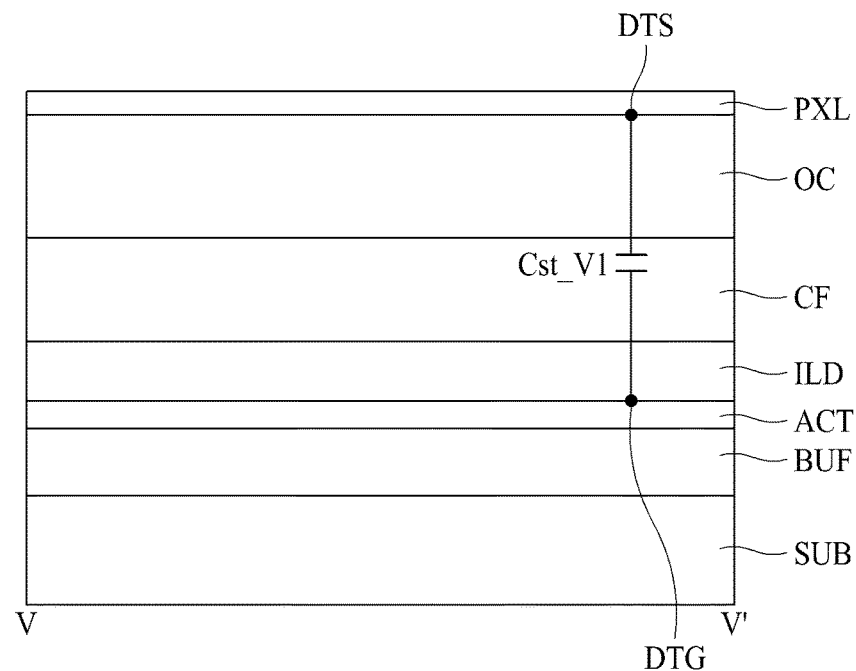
FIG. 18 is a cross-sectional view taken along line V-V' of FIG. 17.
Figure 19:
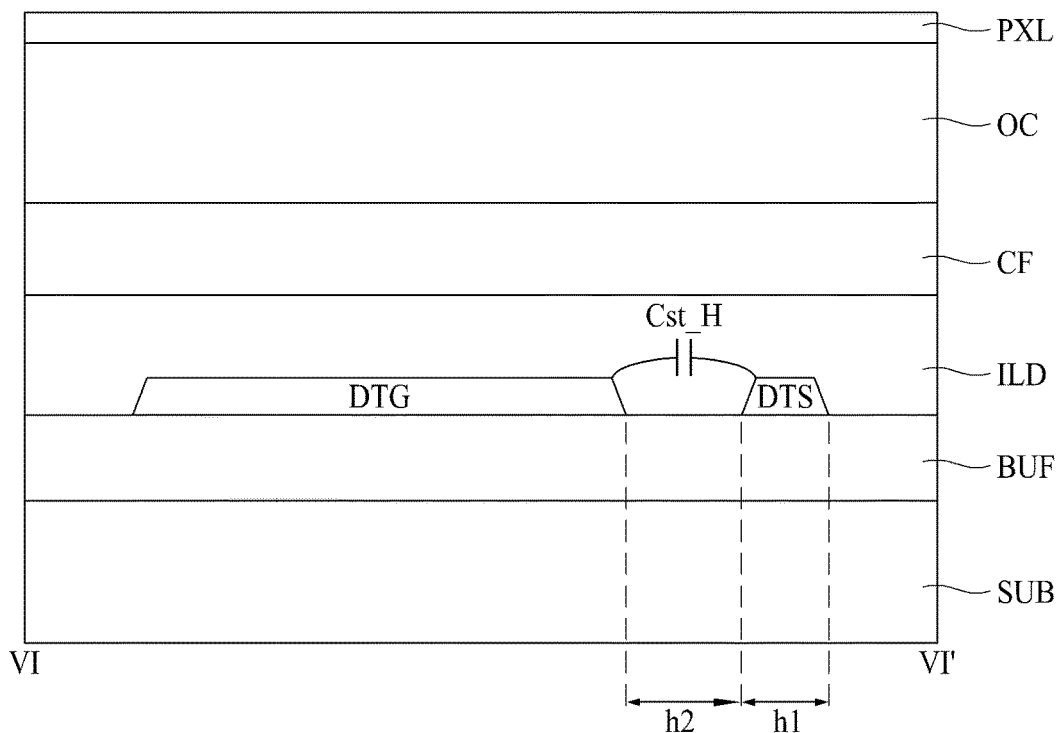
FIG. 19 is a cross-sectional view taken along line VI-VI' of FIG. 17.
Figure 20:
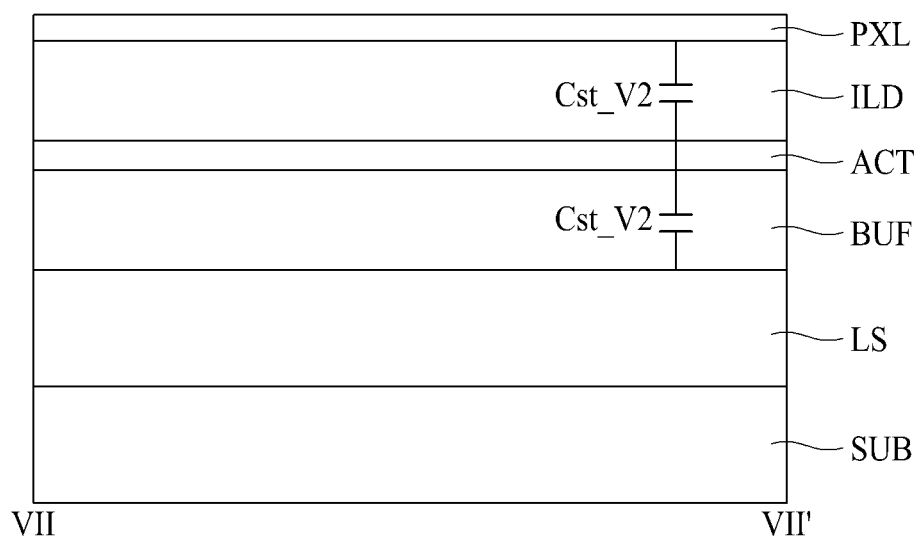
FIG. 20 is a cross-sectional view taken along line VII-VII' of FIG. 17.

FIG. 17 is a plane view illustrating a unit pixel of a display device according to various aspects of the present disclosure. FIG. 18 is a cross-sectional view taken along line V-V' of FIG. 17. FIG. 19 is a cross-sectional view taken along line VI-VI' of FIG. 17. FIG. 20 is a cross-sectional view taken along line VII-VII' of FIG. 17. In FIG. 17, the number of masks may be reduced as compared with the unit pixel of the display device of FIG. 5, and is modified from the structure of the active layer of the opening area in FIG. 5. Therefore, in the following description, elements modified from those in the display device of FIG. 5 will be described and a repeated description of the other same elements as those of FIG. 5 will be omitted.

Referring to FIGS. 17 to 20, in the display device according to various aspects of the present disclosure, the source/drain electrode is omitted, and are replaced with the gate electrode. Therefore, the process of forming the source/drain electrode and a mask process for forming a contact hole for the source/drain electrode may be reduced.

As shown in FIG. 17, the horizontal power line EVDD_H extended in a horizontal direction between the power lines EVDD and electrically connected with the power lines EVDD of left and right sides may be formed as the active layer ACT. The horizontal reference line VREF_H connected with the reference line VREF may be formed as the gate electrode.

As shown in FIG. 18, the buffer layer BUF, the active layer ACT, the inter-layer dielectric film ILD, the color filter CF, the over coat layer OC and the light emitting diode PXL may be disposed in the opening area of each of the subpixels R, B, W and G.

The buffer layer BUF may be formed on the entire surface of the substrate SUB, and the active layer ACT on the buffer layer BUF may be connected to any one of the gate electrode and the source electrode of the driving thin film transistor DR. For example, in FIG. 18, the active layer ACT may be the first electrode pattern DTG conductorized by being connected to the gate electrode of the driving thin film transistor DR. Alternatively, the active layer ACT may be the second electrode pattern DTS conductorized by being connected to the source electrode of the driving thin film transistor DR.

The inter-layer dielectric film ILD, the color filter CF, the overcoat layer OC, and the light emitting diode PXL may be formed on the active layer ACT.

The first electrode pattern DTG formed by conductorization of the active layer ACT and the first electrode ANO of the light emitting diode PXL may be spaced apart from each other by interposing the inter-layer dielectric film ILD, the color filter CF, and the overcoat layer OC, whereby a vertical capacitor Cst_V1 may be formed in a vertical direction. Alternatively, the vertical capacitor Cst_V1 may be formed in a vertical direction between the second electrode pattern DTS formed by conductorization of the active layer ACT and the first electrode ANO of the light emitting diode PXL.

That is, the vertical capacitor Cst_V1 shown in FIG. 18 may substantially be the same as the vertical capacitor Cst_V1 shown in FIG. 6.

As shown in FIG. 19, the buffer layer BUF, the active layer ACT, the inter-layer dielectric film ILD, the color filter CF, the over coat layer OC and the light emitting diode PXL may be disposed in the opening area of each of the subpixels R, B, W and G.

The buffer layer BUF may be formed on the entire surface of the substrate SUB, and the active layer ACT on the buffer layer BUF may be connected to any one of the gate electrode and the source electrode of the driving thin film transistor DR. For example, in FIG. 19, the active layer ACT may have a structure in which the first electrode pattern DTG conductorized by being connected to the gate electrode of the driving thin film transistor DR and the second electrode pattern DTS conductorized by being connected to the source electrode of the driving thin film transistor DR are spaced apart from each other in parallel on the same plane.

A horizontal capacitor Cst_H may be formed in a horizontal direction between the first electrode pattern DTG and the second electrode pattern DTS formed by conductorization of the active layer ACT. For example, the first electrode pattern DTG may be formed to have an area wider than that of the second electrode pattern DTS. That is, in order that the first and second electrode patterns DTG and DTS makes up for the horizontal capacitor Cst_H formed at an interval of one time, the vertical capacitor CST_V1 between the conductorized first electrode pattern DTG and the first electrode ANO of the light emitting diode PXL may be increased by increasing the area of the first electrode pattern DTG. Meanwhile, although FIG. 19 shows that the area of the first electrode pattern DTG is wider than that of the second electrode pattern DTS, the second electrode pattern DTS may be formed to have an area wider than that of the first electrode pattern DTG. In this case, the vertical capacitor CST_V1 between the conductorized second electrode pattern DTS and the first electrode ANO of the light emitting diode PXL may be increased by increasing the area of the second electrode pattern DTS.

As shown in FIG. 20, in the second circuit area of each of the subpixels R, B, W and G, the light-shielding layer LS, the buffer layer BUF, the active layer ACT, the inter-layer dielectric film ILD and the light emitting diode PXL may be disposed on the substrate SUB. That is, unlike the dual vertical capacitors of the non-opening area shown in FIG. 8, in FIG. 20, the source/drain electrode SD may be omitted, and the light emitting diode PXL may be disposed to be extended to the area where the source/drain electrode SD is omitted.

The light-shielding layer LS may be disposed on the substrate SUB to overlap the active layer ACT and the light emitting diode PXL. The active layer ACT on the buffer layer BUF may be connected to any one of the gate electrode and the source electrode of the driving thin film transistor DR. For example, in FIG. 20, the active layer ACT may be the first electrode pattern DTG conductorized by being connected to the gate electrode of the driving thin film transistor DR. Alternatively, the active layer ACT may be the second electrode pattern DTS conductorized by being connected to the source electrode of the driving thin film transistor DR.

The inter-layer dielectric film ILD and the light emitting diode PXL may be formed on the active layer ACT. That is, the light-shielding layer LS may be disposed below the active layer ACT by interposing the buffer layer BUF, and the light emitting diode PXL may be disposed above the active layer ACT by interposing the inter-layer dielectric film ILD.

In the first electrode pattern DTG formed by conductorization of the active layer ACT, dual vertical capacitors Cst_V2 may be formed in a vertical direction to each of the light-shielding layer LS therebelow and the light emitting diode PXL thereabove by being spaced apart from the light-shielding layer LS by interposing the buffer layer BUF and being spaced apart from the light emitting diode PXL by interposing the inter-layer dielectric film ILD.

The pixel and the display device including the same according to various aspects of the present disclosure may be described as follows.

The pixel according to various aspects of the present disclosure may include a pixel circuit connected to gate and data lines, and a light emitting diode having a first electrode connected to the pixel circuit, wherein the pixel circuit may include a driving thin film transistor connected to the first electrode of the light emitting diode, a first capacitor formed in a horizontal direction between a gate electrode and a source electrode of the driving thin film transistor, and a second capacitor formed in a vertical direction between the gate electrode of the driving thin film transistor and the first electrode of the light emitting diode.

In the pixel according to various aspects of the present disclosure, the first capacitor may include a plurality of first electrode patterns connected to the gate electrode of the driving thin film transistor, and a plurality of second electrode patterns connected to the source electrode of the driving thin film transistor and disposed between the plurality of first electrode patterns.

In the pixel according to various aspects of the present disclosure, the gate electrode and the source electrode of the driving thin film transistor may constitute an active layer, and the plurality of first electrode patterns and the plurality of second electrode patterns may be made of the same material as that of the active layer.

In the pixel according to various aspects of the present disclosure, each of the plurality of first electrode patterns and the plurality of second electrode patterns may be a finger pattern structure.

In the pixel according to various aspects of the present disclosure, the plurality of first electrode patterns and the plurality of second electrode patterns may be disposed in parallel on the same plane.

In the pixel according to various aspects of the present disclosure, the pixel may further include a first common pattern commonly connected to one side of each of the plurality of first electrode patterns and connected to any one of the gate electrode and the source electrode of the driving thin film transistor, and a second common pattern disposed to be parallel with the first common pattern while being connected to the other one of the gate electrode and the source electrode of the driving thin film transistor and commonly connected to the other side of each of the plurality of second electrode patterns, wherein the plurality of first electrode patterns and the plurality of second electrode patterns may be disposed alternately between the first common pattern and the second common pattern.

In the pixel according to various aspects of the present disclosure, the first capacitor may include a first common electrode pattern connected to the gate electrode of the driving thin film transistor, and a second common electrode pattern disposed to be parallel with the first common electrode pattern while being connected with the source electrode of the driving thin film transistor.

In the pixel according to various aspects of the present disclosure, the second capacitor may be formed between the first common electrode pattern and the first electrode of the light emitting diode.

In the pixel according to various aspects of the present disclosure, the pixel may further include an opening area overlapped with the light emitting diode, and a circuit area overlapped with the pixel circuit, wherein each of the first capacitor and the second capacitor may be disposed in the opening area.

In the pixel according to various aspects of the present disclosure, the circuit area may include a first circuit area disposed at a first side of the opening area, and a second circuit area disposed at a second side of the opening area.

In the pixel according to various aspects of the present disclosure, the pixel circuit may further include a switching circuit connected to the gate and data lines, wherein the driving thin film transistor may be disposed in the first circuit area, and the switching circuit may be disposed in the second circuit area.

In the pixel according to various aspects of the present disclosure, the pixel may further include a reference line to which a reference voltage is supplied, wherein the switching circuit may include a first switching thin film transistor connected to the gate and data lines and the gate electrode of the driving thin film transistor, and a second switching thin film transistor connected to the gate line, the reference line and the source electrode of the driving thin film transistor.

The display device according to various aspects of the present disclosure may include a plurality of subpixels defined by intersection of gate lines and data lines, having an opening area, wherein each of the plurality of subpixels may include a first circuit area disposed at a first side of the opening area, a second circuit area disposed at a second side of the opening area, and a capacitor overlapped with the opening area and formed between the first circuit area and the second circuit area.

The display device according to various aspects of the present disclosure may include a light emitting diode disposed in the opening area, having a first electrode, a driving thin film transistor disposed in the first circuit area and connected to the first electrode of the light emitting diode, and a switching circuit disposed in the second circuit area and connected to the gate and data lines, wherein the capacitor may include a first capacitor formed in a horizontal direction between a gate electrode and a source electrode of the driving thin film transistor, and a second capacitor formed in a vertical direction between the gate electrode and the source electrode of the driving thin film transistor.

In the display device according to various aspects of the present disclosure, the first capacitor may include a plurality of first electrode patterns connected to the gate electrode of the driving thin film transistor, and a plurality of second electrode patterns connected to the source electrode of the driving thin film transistor and disposed between the plurality of first electrode patterns.

In the display device according to various aspects of the present disclosure, the gate electrode and the source electrode of the driving thin film transistor may constitute an active layer, and the plurality of first electrode patterns and the plurality of second electrode patterns may be made of the same material as that of the active layer.

In the display device according to various aspects of the present disclosure, each of the plurality of first electrode patterns and each of the plurality of second electrode patterns may be disposed in parallel on the same plane as a finger pattern structure.

The display device according to various aspects of the present disclosure may further comprise a first common pattern commonly connected to one side of each of the plurality of first electrode patterns and connected to any one of the gate electrode and the source electrode of the driving thin film transistor, and a second common pattern disposed to be parallel with the first common pattern while being connected to the other one of the gate electrode and the source electrode of the driving thin film transistor and commonly connected to the other side of each of the plurality of second electrode patterns, wherein the plurality of first electrode patterns and the plurality of second electrode patterns may be disposed alternately between the first common pattern and the second common pattern.

In the display device according to various aspects of the present disclosure, the first capacitor may include a first common electrode pattern connected to the gate electrode of the driving thin film transistor, and a second common electrode pattern disposed to be parallel with the first common electrode pattern while being connected with the source electrode of the driving thin film transistor.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A pixel comprising:
   a pixel circuit connected to gate lines and data lines;
   a light emitting diode having a first electrode connected to the pixel circuit;
   an opening area overlapping with the light emitting diode; and
   a circuit area overlapping with the pixel circuit,
   wherein the pixel circuit includes:
   a driving thin film transistor connected to the first electrode of the light emitting diode;
   a first capacitor disposed in a horizontal direction between a gate electrode and a source electrode of the driving thin film transistor; and
   a second capacitor disposed in a vertical direction between the gate electrode of the driving thin film transistor and the first electrode of the light emitting diode, and
   wherein each of the first capacitor and the second capacitor is disposed in the opening area.

2. The pixel of claim 1, wherein the first capacitor includes:
   a plurality of first electrode patterns connected to the gate electrode of the driving thin film transistor; and
   a plurality of second electrode patterns connected to the source electrode of the driving thin film transistor and disposed between the plurality of first electrode patterns.

3. The pixel of claim 2, wherein the gate electrode and source electrode of the driving thin film transistor constitute an active layer, and the plurality of first electrode patterns and the plurality of second electrode patterns are made of a same material as the active layer.

4. The pixel of claim 3, wherein each of the plurality of first electrode patterns and the plurality of second electrode patterns has a finger pattern structure.

5. The pixel of claim 4, wherein the plurality of first electrode patterns and the plurality of second electrode patterns are disposed in parallel on a same plane.

6. The pixel of claim 5, further comprising:
   a first common pattern commonly connected to one side of each of the plurality of first electrode patterns and connected to one of the gate electrode and the source electrode of the driving thin film transistor; and
   a second common pattern disposed to be parallel with the first common pattern while being connected to another one of the gate electrode and the source electrode of the driving thin film transistor and commonly connected to one side of each of the plurality of second electrode patterns,
   wherein the plurality of first electrode patterns and the plurality of second electrode patterns are alternately disposed between the first common pattern and the second common pattern.

7. The pixel of claim 1, wherein the first capacitor includes:
   a first common electrode pattern connected to the gate electrode of the driving thin film transistor; and
   a second common electrode pattern disposed to be parallel with the first common electrode pattern and connected with the source electrode of the driving thin film transistor.

8. The pixel of claim 7, wherein the second capacitor is disposed between the first common electrode pattern and the first electrode of the light emitting diode.

9. The pixel of claim 1, wherein the circuit area includes:
   a first circuit area disposed at a first side of the opening area; and
   a second circuit area disposed at a second side of the opening area.

10. The pixel of claim 9, wherein the pixel circuit further includes a switching circuit connected to the gate and data lines, and
    wherein the driving thin film transistor is disposed in the first circuit area, and the switching circuit is disposed in the second circuit area.

11. The pixel of claim 10, further comprising a reference line to which a reference voltage is supplied,
    wherein the switching circuit includes:
    a first switching thin film transistor connected to the gate and data lines and the gate electrode of the driving thin film transistor; and
    a second switching thin film transistor connected to the gate line, the reference line and the source electrode of the driving thin film transistor.

12. A display device including a plurality of subpixels defined by intersection of gate lines and data lines, having an opening area, each of the plurality of subpixels includes:
    a first circuit area disposed at a first side of the opening area;
    a second circuit area disposed at a second side of the opening area;
    a capacitor overlapping with the opening area and disposed between the first circuit area and the second circuit area;
    a light emitting diode disposed in the opening area, and the light emitting diode having a first electrode;
    a driving thin film transistor disposed in the first circuit area and connected to the first electrode of the light emitting diode; and
    a switching circuit disposed in the second circuit area and connected to the gate and data lines,
    wherein the capacitor includes:
    a first capacitor disposed in a horizontal direction between a gate electrode and a source electrode of the driving thin film transistor; and
    a second capacitor disposed in a vertical direction between the gate electrode and the source electrode of the driving thin film transistor.

13. The display device of claim 12, wherein the first capacitor includes:
    a plurality of first electrode patterns connected to the gate electrode of the driving thin film transistor; and
    a plurality of second electrode patterns connected to the source electrode of the driving thin film transistor and disposed between the plurality of first electrode patterns.

14. The display device of claim 13, wherein the gate electrode and the source electrode of the driving thin film transistor constitute an active layer, and
    wherein the plurality of first electrode patterns and the plurality of second electrode patterns are made of the same material as that of the active layer.

15. The display device of claim 14, wherein each of the plurality of first electrode patterns and each of the plurality of second electrode patterns are disposed in parallel on a same plane as a finger pattern structure.

16. The display device of claim 15, further comprising:
a first common pattern commonly connected to one side of each of the plurality of first electrode patterns and connected to one of the gate electrode and the source electrode of the driving thin film transistor; and
a second common pattern disposed to be parallel with the first common pattern while being connected to another one of the gate electrode and the source electrode of the driving thin film transistor and commonly connected to one side of each of the plurality of second electrode patterns,
wherein the plurality of first electrode patterns and the plurality of second electrode patterns are alternately disposed between the first common pattern and the second common pattern.

17. The display device of claim 12, wherein the first capacitor includes:
a first common electrode pattern connected to the gate electrode of the driving thin film transistor; and
a second common electrode pattern disposed in parallel with the first common electrode pattern and connected with the source electrode of the driving thin film transistor.

18. The display device of claim 12, wherein the subpixels of different rows adjacent to one another are disposed in a mirror shape and share common lines among the subpixels of different rows adjacent to one another.

19. A pixel comprising:
an opening area;
a first circuit area disposed at a first side of the opening area;
a second circuit area disposed at a second side of the opening area;
a capacitor overlapping with the opening area and disposed between the first circuit area and the second circuit area;
a light emitting diode disposed in the opening area, and the light emitting diode having a first electrode;
a driving thin film transistor disposed in the first circuit area and connected to the first electrode of the light emitting diode; and
a switching circuit disposed in the second circuit area and connected to the gate and data lines,
wherein the capacitor includes:
a first capacitor disposed in a horizontal direction between a gate electrode and a source electrode of the driving thin film transistor; and
a second capacitor disposed in a vertical direction between the gate electrode and the source electrode of the driving thin film transistor.

* * * * *